United States Patent
Nedovic

(10) Patent No.: US 8,873,693 B2
(45) Date of Patent: Oct. 28, 2014

(54) PHASE AVERAGING-BASED CLOCK AND DATA RECOVERY

(75) Inventor: Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 387 days.

(21) Appl. No.: 13/239,267

(22) Filed: Sep. 21, 2011

(65) Prior Publication Data

US 2013/0070882 A1  Mar. 21, 2013

(51) Int. Cl.
*H03D 3/24* (2006.01)
*H03L 7/23* (2006.01)

(52) U.S. Cl.
CPC ..................................... *H03L 7/235* (2013.01)
USPC ........... 375/376; 375/374; 375/375; 375/373; 375/327; 455/260; 455/265; 327/147; 327/150; 327/156; 327/159

(58) Field of Classification Search
USPC .......... 375/376, 375, 374, 373, 327; 455/260, 455/265; 327/147, 150, 156, 159
See application file for complete search history.

(56) References Cited

U.S. PATENT DOCUMENTS 8,085,893 B2 * 12/2011 Werner .......................... 375/376
2010/0321120 A1 * 12/2010 Kim et al. ....................... 331/25

OTHER PUBLICATIONS

Hanumolu, Pavan K. et al., "A Wide-Tracking Range Clock and Data Recovery Circuit," *IEEE Journal of Solid-State Circuits* (43, 2), Feb. 2008.
Larrson, Patrrik, A 2-1600-MHz CMOS Clock Recovery PLL with Low-V dd Capability, *IEEE Journal of Solid-State Circuits* (34, 12), Dec. 1999.
Nedovic, Nikola et al., "A 2 x 22Gb/s SFI5.2 CDR/Deserializer in 65nm CMOS Technology," *Symposium on VLSI Circuits*, p. 10-11, Jun. 2009.
Sidiropoulos, Stefanos et al., "A Semidigital Dual Delay-Locked Loop," *IEEE Journal of Solid-State Circuits* (32 ,11), Nov. 1997.

* cited by examiner

*Primary Examiner* — Phuong Phu
(74) *Attorney, Agent, or Firm* — Baker Botts L.L.P.

(57) ABSTRACT

In one embodiment, a method includes adjusting a first frequency of a first clock signal based on a frequency difference between the first frequency and a reference clock signal frequency of a reference clock signal, and further adjusting the first frequency and a first phase of the first clock signal based on a phase difference between the first clock signal and an input data bit stream and the frequency difference between the first frequency and the reference clock signal frequency to substantially lock the first frequency and the first phase of the first clock signal to the input data bit frequency and input data bit phase of the input data bit stream.

19 Claims, 4 Drawing Sheets

PHASE AVERAGING-BASED CLOCK AND DATA RECOVERY

TECHNICAL FIELD

The present disclosure relates generally to clock and data recovery (CDR).

BACKGROUND

CDR circuits (or systems) are generally used to sample an incoming data signal, extract (or recover) the clock from the incoming data signal, and retime the sampled data to produce one or more recovered data bit streams. A phase-locked loop (PLL)-based CDR circuit is a conventional type of CDR circuit. A PLL circuit is an electronic control system that may be used, in part or in whole, to generate or maintain one signal that is locked onto the phase and frequency of another signal. By way of example, in a conventional PLL-based CDR, a phase detector compares the phase between input data bits from a serial input data stream and a clock signal generated by a voltage-controlled oscillator (VCO). In response to the phase difference between the input data and the clock, the phase detector generates phase or frequency correction signals. A charge pump drives a current to or from a loop filter according to the correction signals. The loop filter outputs a control voltage $V_{CTRL}$ for the VCO based on the current driven by the charge pump. The loop acts as a feedback control system that tracks the phase and frequency of the input data stream with the phase and frequency of the clock that the loop generates.

DESCRIPTION OF EXAMPLE EMBODIMENTS

Figure 1:
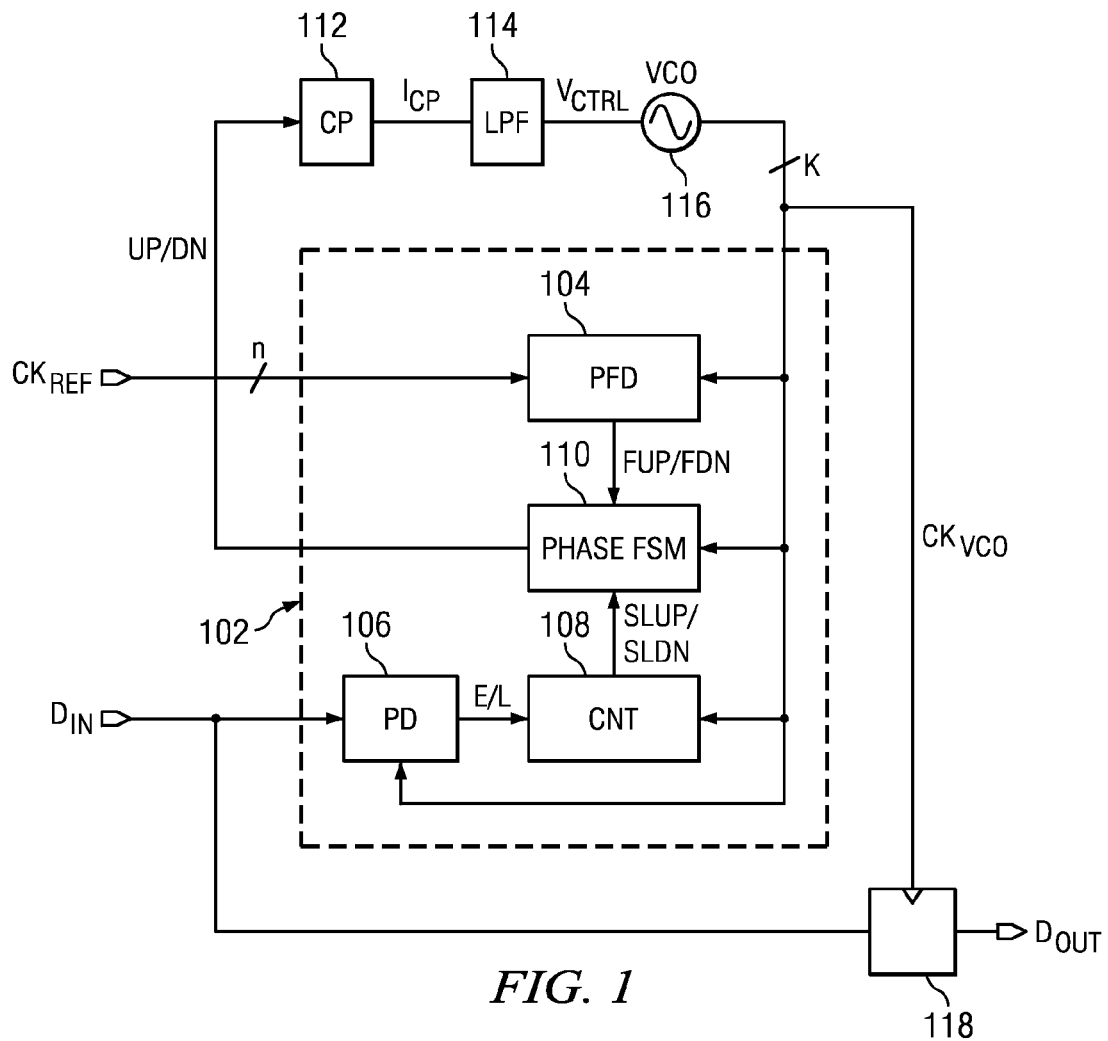
FIG. 1 illustrates an example CDR architecture.

Particular embodiments relate to an electronic circuit, device, system, or method for clock and data recovery (CDR) for a serial communication system application. More particularly, the present disclosure provides examples of a CDR architecture that receives an input data bit stream, generates a clock signal based on the input data bits in the input data bit stream, recovers the data bits in the input data bit stream by sampling the input data bit stream according to the generated clock signal, and outputs a recovered data bit stream with the bits recovered from the input data bit stream. In particular embodiments, the CDR architecture includes a phase-averaging architecture that does not include or use phase interpolators, and thus, has reduced power consumption and area as compared with that required by conventional CDR architectures that include or use phase interpolators. Particular embodiments also eliminate or reduce the need or existence of, or for, a trade-off between compensating for jitter generation, including that generated by a VCO, and compensating for jitter transfer, including that transferred with the input data bit stream.

As used herein, one stream may refer to one wire, and vice versa, where appropriate, or alternately, one stream may refer to one bus (e.g., multiple wires or communication lines), and vice versa, where appropriate. Additionally, the signals or streams described below may be differential signals or streams (e.g., a signal that is formed by the difference of a data signal and its complement), where appropriate. Furthermore, as used herein, "or" may imply "and" as well as "or;" that is, "or" does not necessarily preclude "and," unless explicitly stated or implicitly implied.

Clock and data recovery (CDR) circuits are used to extract a clock signal from an incoming serial data signal, retime and usually de-multiplex the data. A problem with conventional phase-locked-loop (PLL) based CDRs is that there is only one parameter, the loop bandwidth, that determines the gain (or attenuation) of both the jitter transferred into the system with the input data and the jitter generated by the VCO or other system components. For example, when the loop bandwidth is increased, the gain characteristics of the jitter generated improve (e.g., relatively higher frequency generated jitter is attenuated) while the gain characteristics of the jitter transferred worsen (e.g., relatively higher frequency transferred jitter is passed). Likewise, when the loop bandwidth is decreased, the gain characteristics of the jitter generated worsen (e.g., relatively lower frequency generated jitter is passed) while the gain characteristics of the jitter transferred improve (e.g., relatively lower frequency generated jitter is attenuated). Hence, in conventional PLL-based CDRs, improving the gain characteristics of the jitter transferred comes at the expense of worsening the gain characteristics of the jitter generated, and vice versa. Phase-interpolator-based CDRs have become commonly utilized in short-reach input/output (IO) system applications, such as backplane communications or on-board communications, due to, for example, their ability to perform seamless frequency acquisition, hardware reuse among several receive blocks, and implementations that attempt to decouple jitter generation from jitter transfer. However, in conventional phase-interpolator-based CDRs, low frequency jitter transferred with the input data is passed and the CDR will track it resulting in erroneous operation. Additionally, high frequency jitter generated by, for example, the VCO of the CDR, will be passed again resulting in erroneous operation. Conversely, high frequency jitter transferred in the input data is attenuated and hence, filtered out, while low frequency jitter generated by, again for example, the VCO of the CDR, will also be attenuated and hence, filtered out.

Moreover, due to the fact that low jitter request a high resolution phase interpolator, phase interpolators are high power-consuming circuit components, and thus, undesirable or unsuitable for many low-power applications or applications where it is desirable to minimize power consumption or area. Additionally, many conventional phase-interpolator-based CDRs require multiple phase interpolators, further exacerbating the problems associated with phase-interpolator-based CDRs. For example, some conventional phase-interpolator-based CDRs require one phase interpolator for each phase of a multi-phase clock signal, such as a multi-phase clock signal generated by a VCO in the CDR, or another clock signal used in sampling input data bits from an input data bit stream.

FIG. 1 illustrates an example embodiment of a CDR architecture, system, device, or circuit 100 ("CDR 100") based on, or utilizing, a phase-averaging scheme or technique. In particular embodiments, CDR 100 performs CDR on an input data bit stream $D_{IN}$ without the use of a phase interpolator. CDR 100 is generally configured to receive input data bits from the input data bit stream $D_{IN}$, generate a clock signal $CK_{VCO}$ based on the input data bits, recover the input data bits by sampling the input data bits based on the generated clock signal $CK_{VCO}$, and generate an output stream $D_{OUT}$ that comprises the recovered data bits. In particular embodiments, CDR 100 includes a digital block 102 that includes a phase and frequency detector (PFD) 104, a phase detector (PD) 106, a digital filter (counter (cnt)) 108, and a finite state machine (FSM) 110. In particular embodiments, CDR 100 further includes a charge pump (CP) 112 that produces an output current $I_{CP}$ based on phase-correction signals UP or DN received from FSM 110, a low-pass filter (LPF) 114 that generates a VCO control voltage signal $V_{CTRL}$ based on the current $I_{CP}$, a voltage-controlled oscillator (VCO) 116 that generates a k-phase clock signal $CK_{VCO}$ having a VCO clock frequency and phase based on the control signal $V_{CTRL}$, and a sampler 118 that samples the input data bit stream $D_{IN}$ (which may be demultiplexed into k or some other suitable number of individual streams) based on the k-phase clock signal $CK_{VCO}$ to generate a recovered output data bit stream $D_{OUT}$. In some embodiments, CP 112 may not be needed in the VCO feedback loop as LPF 114 may generate a VCO control voltage signal based on phase-correction signals UP or DN received from FSM 110.

Those of skill in the art will recognize that, in general, an m-phase clock signal may, in physical implementation, actually refer to m (or fewer) individual clock signals of fixed phase offsets relative to one another and each having a shared clock frequency that is 1/m the frequency or rate of the input data the m-phase clock signal is used to sample. This allows the individual clock signals that are collectively referred to as the m-phase clock signal to have lower frequencies, and thus, enable the system to cope with high input data rates. For example, in one example embodiment, each constituent clock signal of the k-phase clock signal $CK_{VCO}$ may be used to sample a corresponding one of the k individual data bit streams generated by demultiplexing the input data bit stream $D_{IN}$.

In particular embodiments, FSM 110 is configured to ultimately track the frequency and phase of the k-phase clock signal $CK_{VCO}$ generated by VCO 116 with respect to the frequency and phase of the input data bits in input data bit stream $D_{IN}$. This is accomplished by means of two overlapping loops, a phase loop comprising PD 106, digital filter 108, FSM 110, charge pump 112, LPF 114, and VCO 116 and a frequency loop comprising PFD 104, FSM 110, charge pump 112, LPF 114, and VCO 116. In particular embodiments, the phase and frequency loops converge at different times during operation of CDR 100. In particular embodiments, the frequency loop converges first causing VCO 116 to begin to lock the frequency of the VCO clock signal $CK_{VCO}$ to the frequency of the reference clock signal $CK_{REF}$. In particular embodiments, the phase loop then converges causing VCO 116 to lock the frequency and phase of the VCO clock signal $CK_{VCO}$ to the frequency and phase of the input data bit stream $D_{IN}$.

In particular embodiments, and as required by some implementations, PFD 104 is a linear phase and frequency detector. In particular embodiments, PFD 104 receives an n-phase reference clock signal $CK_{REF}$ having a reference clock frequency (which is generally different and typically less than the frequency of the VCO clock signal $CK_{VCO}$) as well as the k-phase VCO clock signal $CK_{VCO}$ generated by VCO 116. In one example embodiment, PFD 104 samples the several (e.g., n) phases of the n-phase reference clock signal $CK_{REF}$ with the k-phase VCO clock signal $CK_{VCO}$. In an alternate example embodiment, PFD 104 oversamples the k-phase VCO clock signal $CK_{VCO}$ with several (e.g., n) phases of the n-phase reference clock signal $CK_{REF}$. In particular embodiments, PFD 104 generates frequency-correction signals FUP or FDN when the samples of the n-phase reference clock made by the VCO clock change with respect to the samples made by the preceding VCO clock edge.

Figure 2:
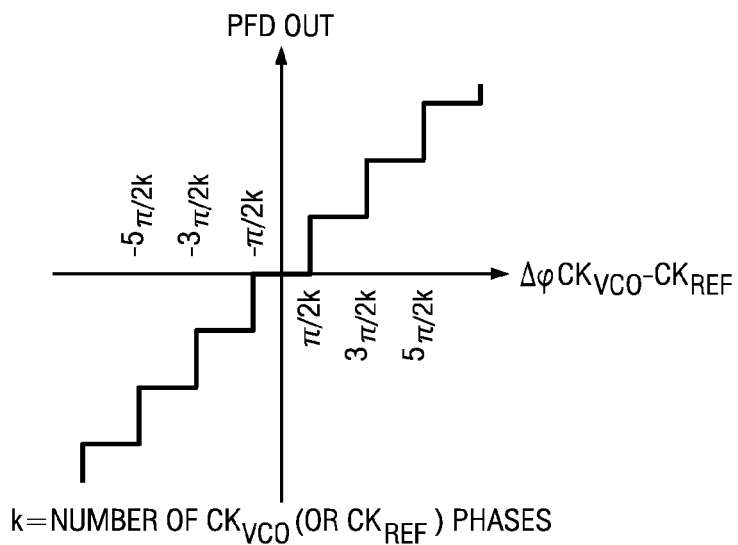
FIG. 2 illustrates an example of an example phase and frequency detector in the CDR architecture of FIG. 1 as a function of the frequency difference between a VCO clock signal and a reference clock signal.
Figure 3:
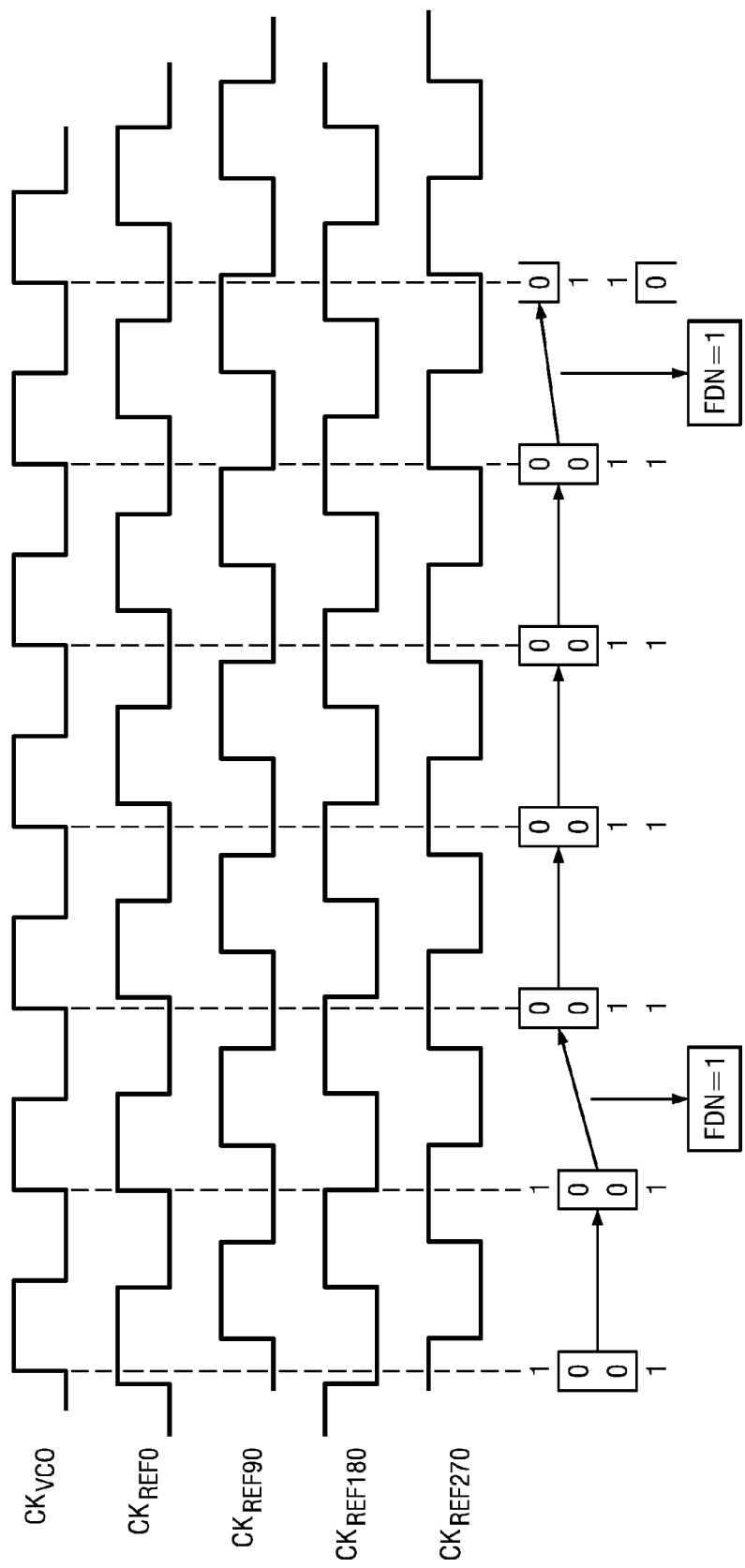
FIG. 3 illustrates an example four-phase clock signal as well as a minimum detectable phase offset and minimum correctable phase error.

FIG. 2 illustrates a plot showing the output of PFD 104 as a function of the frequency difference between the VCO clock signal $CK_{VCO}$ and the reference clock signal $CK_{REF}$. In this manner, PFD 104 tracks or records the steady phase increase between the VCO clock signal $CK_{VCO}$ and the reference clock signal $CK_{REF}$ as the frequency difference, which, as described below, will be offset by the phase loop. PFD 104 also records the phase error due to the VCO clock signal $CK_{VCO}$ and reference clock signal $CK_{REF}$ phase noise. The phase error is quantized in the number of units that is inversely proportional to the resolution of PFD 104. For example, if the reference clock $CK_{REF}$ is a four-phase clock signal (e.g., comprising constituent clock signals $CK_{REF0}$, $CK_{REF90}$, $CK_{REF180}$, and $CK_{REF270}$ having relative phases of 0, 90, 180, and 270 degrees, respectively), as FIG. 3 illustrates, the minimum detectable phase offset, and consequently the minimum correctable phase error, may be 90 degrees (i.e., 360/4 degrees).

Figure 4:
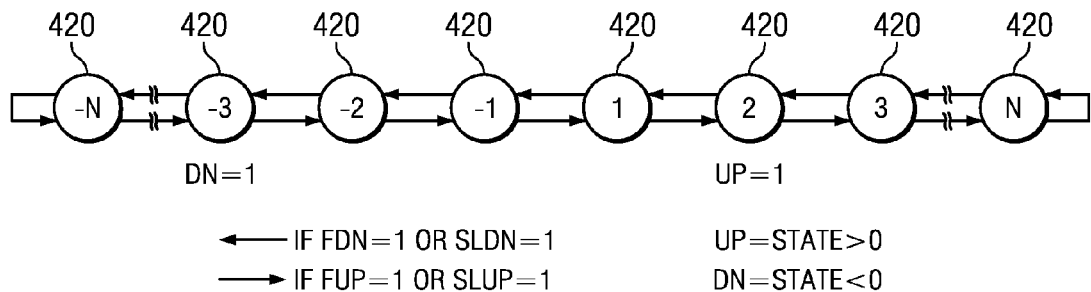
FIG. 4 illustrates an example finite state machine in the CDR architecture of FIG. 1.
Figure 5A:
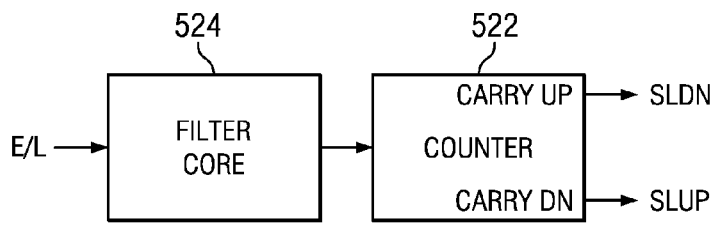
FIGS. 5A and 5B illustrate example digital filters suitable for use in the CDR architecture of FIG. 1.
Figure 5B:
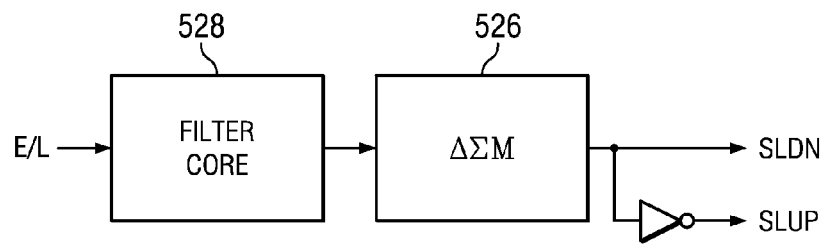

In particular embodiments, digital filter 108 has a pole at z=1; that is; digital filter 108 is configured to perform integration. FIG. 4 illustrates the functionality of FSM 110 in terms of the 2N possible states 420 (e.g., N possible positive states 420 and N possible negative states 420) of FSM 110. FIGS. 5A and 5B illustrate particular example implementations of FSM 110. FSM 110 is configured with a number (2N) of possible states as FIG. 4 illustrates, each of which is a representation of the phase of the VCO clock signal $CK_{VCO}$ with respect to the phase of the input data bits in input data bit stream $D_{IN}$. In particular embodiments, if the current state of FSM 110 is designated by a value below zero (a negative state), this means that the VCO clock signal $CK_{VCO}$ is too fast (or the data in $D_{IN}$ is lagging the VCO clock signal $CK_{VCO}$) and FSM 110 asserts the DN phase-correction signal input to charge pump 112 to decrease the current $I_{CP}$, hence, resulting in a negative phase shift or frequency shift in the VCO clock signal $CK_{VCO}$. Likewise, if the current state of FSM 110 is designated by a value above zero (a positive state), this means that the VCO clock signal $CK_{VCO}$ is too slow or lagging the data in $D_{IN}$ and FSM 110 asserts the UP phase-correction signal input to charge pump 112 to increase the current $I_{CP}$, hence, resulting in a positive phase shift or frequency shift in the VCO clock signal $CK_{VCO}$. However, as illustrated, the state of FSM 110 is updated by the both the frequency detector PFD 104 controlled by the reference clock $CK_{REF}$, via frequency-correction signals FUP and FDN, as well as by phase detector PD 106 based on the data input $D_{IN}$ by way of the digital filter (counter) 108, via compensation signals SLUP or SLDN, where FUP and SLUP result in the same positive state transition in FSM 110 and where FDN and SLDN result in the same negative state transition in FSM 110.

In one example embodiment, if the phase or frequency of the VCO clock signal $CK_{VCO}$ is lagging or less than that of the reference clock signal $CK_{REF}$, PFD 104 asserts the FDN frequency correction signal resulting in a negative state transition (e.g., the state of FSM 110 moves left by one or more states depending on the magnitude of FDN, which may be constant or variable in various embodiments) in FSM 110.

Likewise, if the phase or frequency of the VCO clock signal $CK_{VCO}$ is leading or greater than that of the reference clock signal $CK_{REF}$, PFD 104 asserts the FUP frequency correction signal resulting in a positive state transition (e.g., the state of FSM 110 moves right by one or more states depending on the magnitude of FUP, which may be constant or variable in various embodiments) in FSM 110.

In embodiments used in plesiochronous communication applications, there may be a small frequency difference between the reference clock signal $CK_{REF}$ and the input data bit stream $D_{IN}$. During the frequency acquisition portion of operation in which the frequency of the VCO clock signal CKVCO is initially acquired based on the frequency of the reference clock signal $CK_{REF}$, the frequency of the early and late signal assertions, E and L, respectively, output from phase detector 106 based on whether the input data bits in $D_{IN}$ are early (resulting in the assertion of the E signal by phase detector 106) or late (resulting in the assertion of the L signal by phase detector 106) relative to the VCO clock signal $CK_{VCO}$, is above the bandwidth of the digital filter 108. Those of skill in the art will appreciate that the naming convention (e.g., early or late, and E and L) is chosen for didactic purposes and may, of course, be swapped (e.g., E may be asserted when the VCO clock signal $CK_{VCO}$ is early with respect to the input data bits in input data bit stream $D_{IN}$). Referring back, in particular embodiments, since, during this period of operation, the frequency of the early and late signal assertions, E and L, respectively, output from phase detector 106, is above the bandwidth of digital filter 108, only the frequency detector PFD 104 effectively drives FSM 110 (via frequency-correction signals FUP and FDN) and thus causes the frequency lock of the VCO clock signal $CK_{VCO}$ to the reference clock signal $CK_{REF}$.

In particular embodiments, once the frequency of the early (E) and late (L) signal assertions drops below the bandwidth of the digital filter 108, the phase loop converges and VCO 116 starts tracking the input data bits from input data bit stream $D_{IN}$. When in phase lock (when the frequency and phase of $CK_{VCO}$ match the frequency and phase of $D_{IN}$), digital filter 108 is converged to a non-zero value that is representative of the frequency mismatch between the reference clock signal $CK_{REF}$ and the clock signal $CK_{VCO}$ generated by VCO 116. This non-zero value is represented by the average value (e.g., duty cycle) of signals SLUP and SLDN output from digital filter 108 to adjust the state of FSM 110 to be between states +1 and −1 on average (or at some state 0 in alternate embodiments) to compensate for the FUP or FDN frequency-correction signals output from PFD 104, since the VCO clock signal $CK_{VCO}$ and the reference clock signal $CK_{REF}$ are no longer in frequency lock (as the CDR 100 is now in the phase lock portion of operation governed by the phase loop).

In one example embodiment, the signals SLUP and SLDN can be obtained by carry signals of an integrating counter 522, which, together with some suitable filter core block 524, may implement digital filter 108, as FIG. 5A illustrates. In one alternate example embodiment, the signals SLUP and SLDN can be obtained as the output of a delta-sigma modulator 526, which, together with some suitable filter core block 528, may implement digital filter 108, as FIG. 5B illustrates. In this way, the period shift of the state of FSM 110 in one direction due to the frequency mismatch between the reference clock signal CKREF and the clock signal CKVCO generated by VCO 116, is compensated for by the shift in state in the opposite direction due to the assertion of the respective signal SLUP or SLDN, thus enabling $CK_{VCO}$ to be locked to the input data bits in input data bit stream $D_{IN}$ when there is a frequency mismatch between $CK_{VCO}$ and $CK_{REF}$ and between $D_{IN}$ and $CK_{REF}$.

In particular embodiments, the phase loop is designed to have low bandwidth while the frequency loop is designed to have high bandwidth. In this way, low frequency jitter transferred in with the input data bit stream $D_{IN}$ is attenuated via the phase loop (note that the high frequency jitter transferred in with the input data bit stream $D_{IN}$ is also attenuated by construction) while high frequency jitter generated by VCO 116 or other components of CDR 100 is attenuated via the frequency loop (note that the low frequency jitter generated by VCO 116 or other components of CDR 100 is also attenuated by construction).

Figure 6:
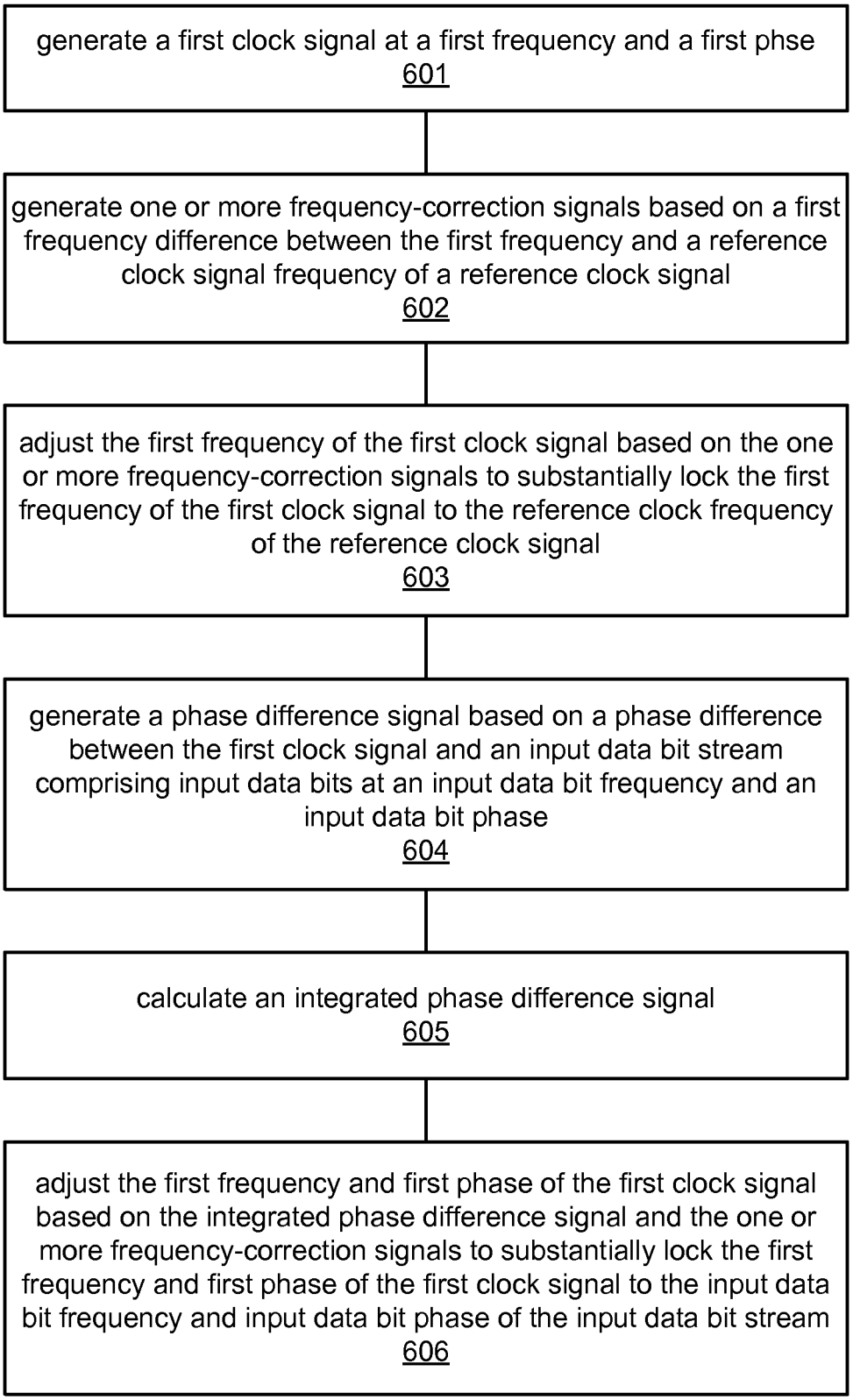
FIG. 6 shows a flowchart illustrating an example method of phase-averaging based clock and data recovery.

FIG. 6 shows a flowchart illustrating an example method of phase-averaging based clock and data recovery. In particular embodiments, a clock signal generator (e.g., a voltage-controlled oscillator or VCO) may generate a first clock signal at a first frequency and a first phase (601). In particular embodiments, a frequency detector may generate one or more frequency-correction signals based on a first frequency difference between the first frequency and a reference clock signal frequency of a reference clock signal (602). In particular embodiments, the clock signal generate may adjust the first frequency of the first clock signal based on the one or more frequency-correction signals to substantially lock the first frequency of the first clock signal to the reference clock frequency of the reference clock signal (603). In particular embodiments, a phase detector may generate a phase difference signal based on a phase difference between the first clock signal and an input data bit stream comprising input data bits at an input data bit frequency and an input data bit phase (604). In some embodiments, the reference clock frequency is the same as the input data bit frequency. In other embodiments, the reference clock frequency is different from the input data bit frequency. In particular embodiments, an integrator may calculate an integrated phase difference signal (605). In particular embodiments, the clock signal generator may further adjust the first frequency and first phase of the first clock signal based on the integrated phase difference signal and the one or more frequency-correction signals to substantially lock the first frequency and first phase of the first clock signal to the input data bit frequency and input data bit phase of the input data bit stream (606). In particular embodiments, a finite-state machine (FSM) may transition between states based on the one or more frequency-correction signals and generate one or more phase-correction signals based on a current state of the FSM. The clock signal generator may further adjust the frequency of the first clock signal based on the phase-correction signals to substantially lock the first frequency of the first clock signal to the reference clock frequency of the reference clock signal. In some embodiments, the FSM may transition between states of the FSM based on the integrated phase difference signal and the one or more frequency-correction signals, and generate one or more new phase-correction signals based on a new current state of the FSM. The clock signal generator may further adjust the first frequency and first phase of the first clock signal based on the one or more new phase-correction signals to substantially lock the first frequency and first phase of the first clock signal to the input data bit frequency and input data bit phase of the input data bit stream. In some embodiments, a sampler may sample the input data bits in the input data bit stream based on the further adjusted first clock signal to generate a recovered data bit stream. For example, the sampler may de-multiplexing the input data bit stream into k de-multiplexed data bit streams. In one example embodiment, the first clock signal may comprise a k-phase clock signal, each phase of the first clock signal being used to sample a corresponding one or the k de-multiplexed data bit streams.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
    generating, by a clock signal generator, a first clock signal at a first frequency and a first phase;
    generating, by a frequency detector, a frequency-correction signal based on a frequency difference between the first frequency and a reference clock frequency;
    adjusting, by the clock signal generator, the first clock signal based on the frequency-correction signal to substantially lock the first frequency to the reference clock frequency;
    generating, by a phase detector, a phase difference signal based on a phase difference between the first clock signal and an input data bit stream at an input data bit frequency and an input data bit phase;
    calculating, by a filter, an integrated phase difference signal based on the phase difference signal; and
    further adjusting, by the clock signal generator, the first clock signal based on the integrated phase difference signal and the frequency-correction signal to substantially lock the first frequency and the first phase to the input data bit frequency and the input data bit phase, wherein the frequency-correction signal and the integrated phase difference signal are combined to update the clock signal generator.

2. The method of claim 1, wherein the clock signal generator comprises a voltage-controlled oscillator (VCO).

3. The method of claim 1, wherein the adjusting, by the clock signal generator, the first clock signal based on the frequency-correction signal to substantially lock the first frequency to the reference clock frequency further comprises:
    transitioning between states of a finite state machine (FSM) based on the frequency-correction signal;
    generating, by the FSM, a phase-correction signal based on a current state of the FSM; and
    adjusting, by the clock signal generator, the first clock signal based on the phase-correction signal to substantially lock the first frequency to the reference clock frequency.

4. The method of claim 3, wherein the further adjusting, by the clock signal generator, the first clock signal based on the integrated phase difference signal and the frequency-correction signal to substantially lock the first frequency and the first phase to the input data bit frequency and the input data bit phase further comprises:
    transitioning between states of the FSM based on the integrated phase difference signal and the frequency-correction signal;
    generating, by the FSM, a new phase-correction signal based on a new current state of the FSM; and
    further adjusting, by the clock signal generator, the first clock signal based on the new phase-correction signal to substantially lock the first frequency and the first phase to the input data bit frequency and the input data bit phase.

5. The method of claim 1, wherein the reference clock frequency is the same as the input data bit frequency.

6. The method of claim 1, wherein the reference clock frequency is different from the input data bit frequency.

7. The method of claim 1, further comprising sampling the input data bit stream based on the further adjusted first clock signal to generate a recovered data bit stream.

8. The method of claim 7, further comprising de-multiplexing the input data bit stream into k data bit streams.

9. The method of claim 8, wherein the first clock signal is a k-phase clock signal, wherein each phase of the first clock signal is used to sample a corresponding one of the k data bit streams.

10. A circuit comprising:
    a clock signal generator to:
        generate a first clock signal at a first frequency and a first phase;
        adjust the first clock signal based on a frequency-correction signal to substantially lock the first frequency to a reference clock frequency; and
        further adjust the first clock signal based on an integrated phase difference signal and the frequency-correction signal to substantially lock the first frequency and the first phase to an input data bit frequency and an input data bit phase of an input data bit stream;
    a frequency detector to:
        generate the frequency-correction signal based on a frequency difference between the first frequency and the reference clock frequency;
    a phase detector to:
        generate a phase difference signal based on a phase difference between the first clock signal and the input data bit stream; and
    a filter to:
        calculate the integrated phase difference signal based on the phase difference signal,
    wherein the frequency-correction signal and the integrated phase difference signal are combined to update the clock signal generator.

11. The circuit of claim 10, wherein the clock signal generator comprises a voltage-controlled oscillator (VCO).

12. The circuit of claim 10, further comprising:
    a finite state machine (FSM) to:
        transition between states of the FSM based on the frequency-correction signal; and
        generate a phase-correction signal based on a current state of the FSM;
    and wherein the clock signal generator is further to:
        adjust the first clock signal based on the phase-correction signal to substantially lock the first frequency to the reference clock frequency.

13. The circuit of claim 12, wherein
    the FMS is further to:
        transition between states of the FSM based on the integrated phase difference signal and the frequency-correction signal; and
        generate a new phase-correction signal based on a new current state of the FSM; and
    the clock signal generator is to:
        further adjust the first clock signal based on the new phase-correction signal to substantially lock the first frequency and the first phase to the input data bit frequency and the input data bit phase.

14. The circuit of claim 10, wherein the reference clock frequency is the same as the input data bit frequency.

15. The circuit of claim 10, wherein the reference clock frequency is different from the input data bit frequency.

16. The circuit of claim 10, further comprising:
a sampler to sample the input data bit stream based on the further adjusted first clock signal to generate a recovered data bit stream.

17. The circuit of claim 16, wherein the sampler is further to:
de-multiplex the input data bit stream into k data bit streams.

18. The circuit of claim 17, wherein the first clock signal is a k-phase clock signal, wherein each phase of the first clock signal is used to sample a corresponding one of the k data bit streams.

19. A clock and data recovery circuit comprising:
a frequency regulation loop comprising:
 a frequency detector to generate a frequency-correction signal based on a frequency difference between a first frequency and a reference clock frequency;
 a clock signal generator to:
  generate a first clock signal having the first frequency and a first phase;
  regulate the first frequency based on the frequency-correction signal to substantially lock the first frequency to the reference clock frequency; and
  additionally regulate the first clock signal based on an integrated phase difference signal and the frequency-correction signal to substantially lock the first frequency and the first phase to an input data bit frequency and an input data bit phase of an input data bit stream;
a phase regulation loop comprising:
 a phase detector to generate a phase difference signal based on a phase difference between the first clock signal and the input data bit stream;
 a filter to calculate the integrated phase difference signal based on the phase difference signal; and
 the clock signal generator; and
a sampler to sample the input data stream based on the first clock signal to generate a recovered data bit stream.

* * * * *